(12) United States Patent
Xu et al.

(10) Patent No.: US 9,899,270 B2
(45) Date of Patent: *Feb. 20, 2018

(54) METHODS FOR MANUFACTURING SEMICONDUCTOR DEVICES

(71) Applicant: Institute of Microelectronics, Chinese Academy of Sciences, Beijing (CN)

(72) Inventors: Qiuxia Xu, Beijing (CN); Huilong Zhu, Poughkeepsie, NY (US); Gaobo Xu, Beijing (CN); Huajie Zhou, Beijing (CN); Qingqing Liang, Lagrangeville, NY (US); Dapeng Chen, Beijing (CN); Chao Zhao, Kessel-lo (BE)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/233,320

(22) PCT Filed: Dec. 7, 2012

(86) PCT No.: PCT/CN2012/086114
§ 371 (c)(1),
(2) Date: Jan. 16, 2014

(87) PCT Pub. No.: WO2014/082332
PCT Pub. Date: Jun. 5, 2014

(65) Prior Publication Data
US 2015/0279745 A1    Oct. 1, 2015

(30) Foreign Application Priority Data

Nov. 30, 2012   (CN) .......................... 2012 1 0505536

(51) Int. Cl.
H01L 21/3205    (2006.01)
H01L 21/4763    (2006.01)
(Continued)

(52) U.S. Cl.
CPC ................ *H01L 21/823828* (2013.01); *H01L 21/28088* (2013.01); *H01L 21/28185* (2013.01);
(Continued)

(58) Field of Classification Search
CPC ....... H01L 29/66545; H01L 21/823857; H01L 21/28194; H01L 21/823828;
(Continued)

(56) References Cited

U.S. PATENT DOCUMENTS 6,159,782 A    12/2000   Xiang et al.
8,334,197 B2   12/2012   Lee et al.
(Continued)

FOREIGN PATENT DOCUMENTS

CN    1943027 A      4/2007
CN    101800196 A    8/2010
(Continued)

OTHER PUBLICATIONS

"International Application U.S. Appl. No. PCT/CN2012/086114, International Search Report and Written Opinion dated Aug. 29, 2013", 9 pgs.

(Continued)

*Primary Examiner* — Shouxiang Hu
(74) *Attorney, Agent, or Firm* — Schwegman Lundberg & Woessner, P.A.

(57) ABSTRACT

There is disclosed a method for manufacturing a semiconductor device comprising two opposite types of MOSFETs formed on one semiconductor substrate, the method comprising: forming a portion of the MOSFET on the semicon- (Continued)

ductor substrate, said portion of said MOSFET comprising source/drains regions located in the semiconductor substrate, a dummy gate stack located between the source/drain region and above the semiconductor substrate and a gate spacer surrounding the dummy gate stack; removing the dummy gate stack of said MOSFET to form a gate opening which exposes the surface of the semiconductor substrate; forming an interfacial oxide layer on the exposed surface of the semiconductor structure; forming a high-K gate dielectric on the interfacial oxide layer within the gate opening; forming a first metal gate layer on the high-K gate dielectric; implanting doping ions in the first metal gate layer; forming a second metal gate layer on the first metal gate layer to fill up the gate opening; and annealing to diffuse and accumulate the doping ions at an upper interface between the high-K gate dielectric and the first metal gate layer and at a lower interface between the high-K gate dielectric and the interfacial oxide, and generating an electric dipole at the lower interface between the high-K gate dielectric and the interfacial oxide by interfacial reaction.

14 Claims, 4 Drawing Sheets

(51) Int. Cl.
- H01L 21/8238 (2006.01)
- H01L 21/28 (2006.01)
- H01L 29/49 (2006.01)
- H01L 29/51 (2006.01)
- H01L 29/78 (2006.01)
- H01L 29/66 (2006.01)

(52) U.S. Cl.
CPC ............ *H01L 21/28194* (2013.01); *H01L 21/823842* (2013.01); *H01L 21/823857* (2013.01); *H01L 29/4966* (2013.01); *H01L 29/513* (2013.01); *H01L 29/517* (2013.01); *H01L 29/66545* (2013.01); *H01L 29/7833* (2013.01); *H01L 29/665* (2013.01)

(58) Field of Classification Search
CPC ......... H01L 21/28088; H01L 21/28185; H01L 21/823437; H01L 21/823468; H01L 21/82385; H01L 21/223; H01L 21/265; H01L 21/28044; H01L 21/28061
USPC ....... 438/585, 595, 199, 305, 275, 287, 591, 438/153, 923
See application file for complete search history.

(56) References Cited

U.S. PATENT DOCUMENTS

| 9,196,706 | B2* | 11/2015 | Xu .......................... H01L 29/49 |
| 2002/0130378 | A1 | 9/2002 | Forbes et al. |
| 2004/0185630 | A1 | 9/2004 | Forbes et al. |
| 2006/0051924 | A1* | 3/2006 | Doczy et al. ................ 438/287 |
| 2006/0244087 | A1* | 11/2006 | You .................... H01L 27/14623 257/432 |
| 2010/0052074 | A1 | 3/2010 | Lin et al. |
| 2011/0186937 | A1* | 8/2011 | Scheiper et al. .............. 257/402 |
| 2011/0256704 | A1 | 10/2011 | Xu et al. |
| 2012/0094447 | A1 | 4/2012 | Xu et al. |
| 2012/0280288 | A1* | 11/2012 | Ando et al. ................... 257/288 |
| 2013/0102142 | A1* | 4/2013 | Lee et al. ..................... 438/591 |

FOREIGN PATENT DOCUMENTS

| CN | 101924034 | 12/2010 |
| CN | 102074469 | 5/2011 |
| CN | 102103994 A | 6/2011 |
| CN | 102110689 A | 6/2011 |
| CN | 102280376 A | 12/2011 |

OTHER PUBLICATIONS

"Chinese Application Serial No. 201210505536.X, Office Action dated Dec. 29, 2015", w/ English Translation, (dated Dec. 29, 2015), 12.
"Chinese Application No. 201210505536.X, Office Action dated Aug. 9, 2016", w/ English Translation, (dated Aug. 9, 2016), 15 pgs.
"Chinese Application No. 201210505536.X, Office Action dated Dec. 2, 2016", w/ English Translation, (dated Dec. 2, 2016), 14 pgs.

* cited by examiner

METHODS FOR MANUFACTURING SEMICONDUCTOR DEVICES

CROSS-REFERENCE TO RELATED APPLICATION(S)

This application is a U.S. National Stage Application filed under 35 U.S.C. § 371 of International Application Serial No. PCT/CN2012/086114, filed on Dec. 7, 2012, which application claims priority to a Chinese Patent Application with an application number of No. 201210505536.X, entitled "METHODS FOR MANUFACTURING SEMICONDUCTOR DEVICES" filed on Nov. 30, 2012, which applications are incorporated herein by reference in their entirety.

TECHNICAL FIELD

The present invention relates to the field of semiconductor technique, and particularly, to a method for manufacturing a semiconductor device including a metal gate and a high-k gate dielectric.

BACKGROUND

With development of the semiconductor technology, the feature size of a Metal Oxide Semiconductor Field Effect Transistor (MOSFET) is continuously reduced. The reduction of the size of the MOSFET may lead to a problem of current leakage. The use of a high-k dielectric enables to increase the physical thickness of the gate dielectric while keeping the equivalent oxide thickness (EOT) invariable, thereby to decrease the gate tunneling leakage current. However, the conventional poly-silicon gate is incompatible with the high-k dielectric. The use of the metal gate and the high-K dielectric together may not only avoid the depletion effect of the poly-silicon gate and reduce the gate resistance, but also may avoid penetration of boron to improve the reliability of the device. Thus, the combination of the metal gate and the high-K dielectric are widely applied in MOSFET. There are still many challenges in the integration of the metal gate with the high-K dielectric, such as thermal stability and interface state. Especially because of the Fermi Pinning effect, it is difficult for the MOSFET employing the metal gate and the high-K dielectric to obtain an appropriately low threshold voltage.

In a CMOS application integrating N type and P type MOSFETs, in order to obtain an appropriate threshold voltage, an effective work function of an NMOSFET should be near a bottom of a conduction band of Si, i.e. about 4.1 eV, and an effective work function of a PMOSFET should be near a top of a valence band of Si, i.e. about 5.2 eV. Thus, difference combinations of metal gates and high-K dielectrics may be selected for the NMOSFET and the PMOSFET respectively to implement the desired threshold voltage. As a result, it would therefore be desirable to provide the integration implementation of double metal gates and double high-K dielectrics on one chip. During manufacturing the semiconductor device, the respective photolithography and etching steps are performed for the metal gate and high-K gate dielectric for NMOSFET and PMOSFET, respectively. Thus, the method for manufacturing a semiconductor device comprising double metal gates and double high-K dielectrics are complex and is not suitable for mass production, which may further increase the manufacturing cost.

SUMMARY

The objective of the present invention is to provide an improved method for manufacturing a semiconductor device, in which the effective work function of the semiconductor device may be adjusted during the process of manufacturing.

According to the present invention, there is provided a method for manufacturing a semiconductor device comprising two opposite types of MOSFETs formed on one semiconductor substrate, the method comprising: forming a portion of the MOSFET on the semiconductor substrate, said portion of said MOSFET comprising source/drain regions located in the semiconductor substrate, a dummy gate stack located between the source/drain regions and above the semiconductor substrate and a gate spacer surrounding the dummy gate stack; removing the dummy gate stack of said MOSFET to form a gate opening which exposes a surface of the semiconductor substrate; forming an interfacial oxide layer on the exposed surface of the semiconductor; forming a high-K gate dielectric on the interfacial oxide layer within the gate opening; forming a first metal gate layer on the high-K gate dielectric; implanting doping ions in the first metal gate layer, that is an N-type dopant is implanted into the first metal gate layer of the active region of the N-type MOSFET, and a P-type dopant is implanted into the first metal gate layer of the active region of the P-type MOSFET; forming a second metal gate layer on the first metal gate layer to fill the gate opening; and annealing to diffuse and accumulate the doping ion at an upper interface between the high-K gate dielectric and the first metal gate layer and at a lower interface between the high-K gate dielectric and the interfacial oxide, and generating an electric dipole at the lower interface between the high-K gate dielectric and the interfacial oxide by interfacial reaction.

In this method, on one hand, the doping ion accumulated at the upper interface of the high-K gate dielectric changes property of the metal gate, so as to advantageously adjust the effective work function of the corresponding MOSFET. On the other hand, the doping ion accumulated at the lower interface of the high-K gate dielectric further forms an electric dipole with appropriate polarity by interfacial reaction, so as to further advantageously adjust the effective work function of the corresponding MOSFET. The performance of the semiconductor device obtained by this method indicates better stability and significant effect of adjusting the effective work function of the metal gate. By selecting different dopants for the two types of MOSFET, it may reduce or increase the effective work function. In a CMOS device, the threshold voltages for the two types of MOSFET can be adjusted respectively by only changing the dopants, and it is not necessary to employ different combinations of metal gates and gate dielectrics. Thus, the method may omit corresponding steps of deposition, mask and etching, so as to simplify the process and facilitate mass production.

BRIEF DESCRIPTION OF THE DRAWINGS

In order to better understand the present invention, the present invention should be illustrated in detail from the following figures.

DETAILED DESCRIPTION

Figure 1:
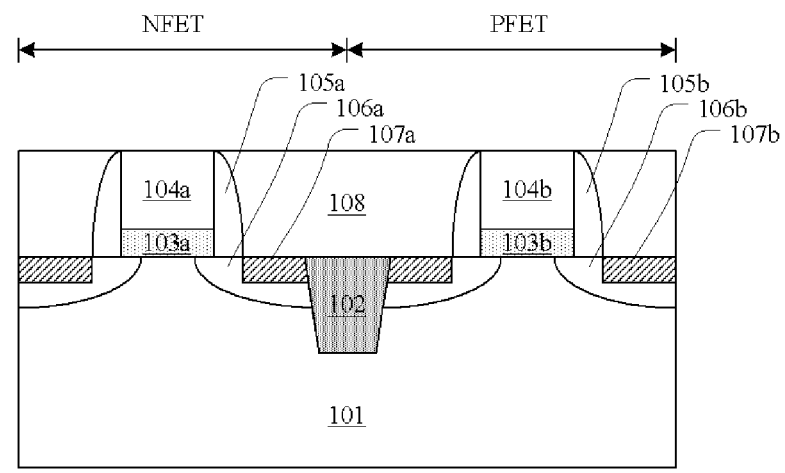
FIGS. 1-7 schematically shows cross section views of a semiconductor structure during various stages for manufacturing a semiconductor device according to one embodiment of the method of the present invention.

The present invention will be described in more details below with reference to the accompanying drawings. In the following description, similar components are indicated with identical or similar reference signs. In the drawings, the respective portions of the figures are not drawn to scale, for the sake of clarity.

Some particular details of the present invention will be described below, such as structures, materials, dimensions, processes and technologies of the device, for better understanding of the present invention. However, it can be understood by one skilled person in the art that the present invention may be implemented without these particular details. Unless especially pointed out in the following, the respective portions of the semiconductor device may be formed by materials which are well known to those skilled in the art or may be formed by material having similar function which is to be developed in future.

In the present application, the phrase "semiconductor structure" generally refers to the semiconductor substrate and the whole layers or regions formed on the semiconductor substrate at each step of the method for manufacturing the semiconductor device. The phrase "source/drain region" refers to both of the source region and drain region of one MOSFET and are indicated with one identical reference sign. The phrase "N type dopant" refers to a dopant which may reduce the effective work function for an N type MOSFET. The phrase "P type dopant" refers to a dopant which may increase the effective work function for a P type MOSFET.

According to one embodiment of the present invention, a method of manufacturing a semiconductor device based on gate-last process is described with reference to FIGS. 1-7. The semiconductor device is a CMOS device including a NMOSFET and a PMOSFET formed on one semiconductor substrate.

In the semiconductor structure shown in FIG. 1, one portion of the device has been accomplished by the gate-last process. On the semiconductor substrate 101 (e.g. on the silicon substrate), it comprises active regions for N-type MOSFETs and P-type MOSFETs separated by a shallow trench isolation 102. In the active region of the N-type MOSFET, a dummy gate stack including a dummy gate dielectric 103a (e.g. silicon oxide) and a dummy gate conductor 104a (e.g. poly-silicon or α-silicon) is formed on the semiconductor substrate 101. The dummy gate stack is surrounded by a gate spacer 105a (i.e. silicon nitride). A source/drain region 106a of the N-type MOSFET is formed in the semiconductor substrate 101. The source/drain region 106a is located at both sides of the dummy gate stack and may comprise an extension region which at least partially extends below the dummy gate dielectric 103a. A silicate region 107a (e.g. nickel silicate, nickel and platinum silicate) is further formed on the surface of the source/drain region 106a to reduce series resistance and contact resistance of the source/drain region 106a. In the active region of P-type MOSFET, a dummy gate stack including a dummy gate dielectric 103b (e.g. silicon oxide) and a dummy gate conductor 104b (e.g. polysilicon or α-silicon) is formed on the semiconductor substrate 101. The dummy gate stack is surrounded by a gate spacer 105b (i.e. silicon nitride). A source/drain region 106b of the P-type MOSFET is formed in the semiconductor substrate 101. The source/drain region 106b is located at both sides of the dummy gate stack and may comprise an extension region which at least partially extends below the dummy gate dielectric 103b. A silicate region 107b (e.g. nickel silicate, nickel and platinum silicate) is further formed on the surface of the source/drain region 106b to reduce series resistance and contact resistance of the source/drain region 106b.

The semiconductor structure further comprises an interlayer dielectric layer 108 (e.g. silicon nitride or silicon oxide) covering the active region. By a chemical mechanical polishing (CMP) process, the surface of the interlayer dielectric layer 108 is planarized and the top surfaces of the dummy conductor 104a and 104b are exposed. The interlayer dielectric layer 108 not only protects the active region in the subsequent steps, but also functions as a hard mask as mentioned in the following.

Figure 2:
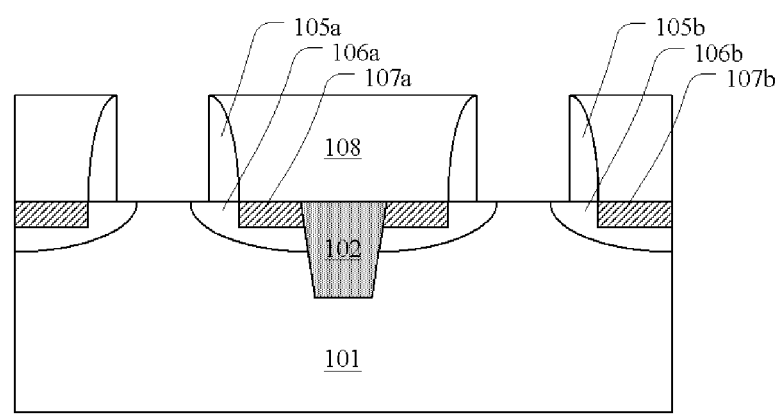

Next, by utilizing the interlayer dielectric layer 108 as a hard mask, the dummy gate conductors 104a and 104b are selectively removed by dry etching such as ion beam milling etching, plasma etching, reactive ion etching, laser ablation, or wet etching using etching agent solution, and then the dummy gate dielectrics 103a and 103b are further selectively removed, as shown in FIG. 2. Gate openings are formed in the active regions of the N-type MOSFET and P-type MOSFET respectively after the etching step to expose the surface of the semiconductor substrate 101.

Figure 3:
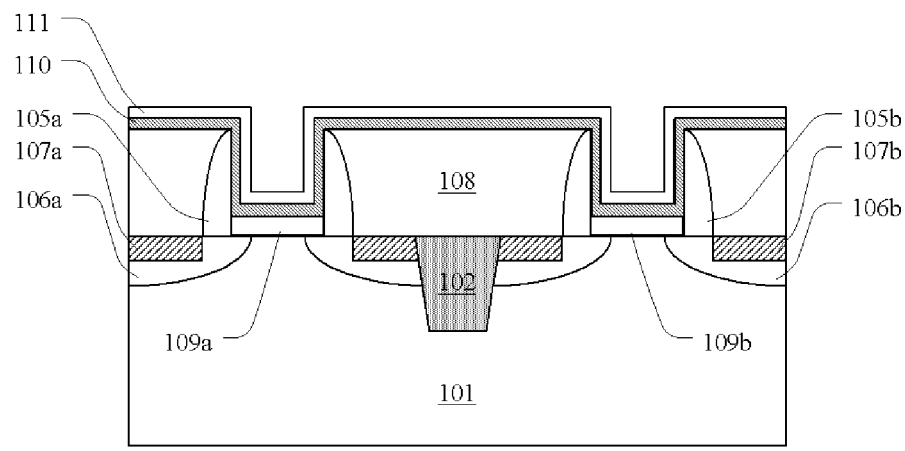

Next, an interfacial oxide layer 109 (e.g. silicon oxide) is formed on the exposed surface of the semiconductor substrate 101 by chemical oxidation or additional thermal oxidation. A high-K dielectric layer 110 and a first metal gate layer 111 are formed sequentially on the surface of the semiconductor structure by means of a known deposition process, such as ALD (Atomic Layer Deposition), CVD (Chemical Vapor Deposition), MOCVD (Metal Organic Chemical Vapor Deposition), PVD (Physical Vapor deposition), sputtering and the like, as shown in FIG. 3. The high-K dielectric layer 110 and the first metal gate layer 111 are formed on the bottom and sidewalls of the gate opening, but do not fill up the gate opening.

The high-K dielectric layer 110 is formed of an appropriate material which has a dielectric constant larger than that of $SiO_2$, such as one material selected from a group consisting of $ZrO_2$, ZrON, ZrSiON, HfZrO, HfZrON, HfON, $HfO_2$, HfAlO, HfAlON, HfSiO, HfSiON, HfLaO, HfLaON and any combination thereof. The first metal gate layer 111 may be formed of an appropriate material for forming a metal gate, such as one material selected from a group consisting of TiN, TaN, MoN, WN, TaC, TaCN and any combination thereof. In one example, the high-K dielectric layer 110 is, for example, a $HfO_2$ layer with a thickness of about 1.5-5 nm, and the first metal gate layer 111 is, for example, a TiN layer with a thickness of about 2-10 nm.

Preferably, a step of post deposition annealing of the high-K dielectric layer 110 may be performed between the steps of forming the high-K dielectric layer 110 and forming the first metal gate layer 111 to improve the quality of the high-K dielectric layer, which is advantageous to obtain a uniform thickness of the subsequently formed first metal gate layer 111.

Figure 4:
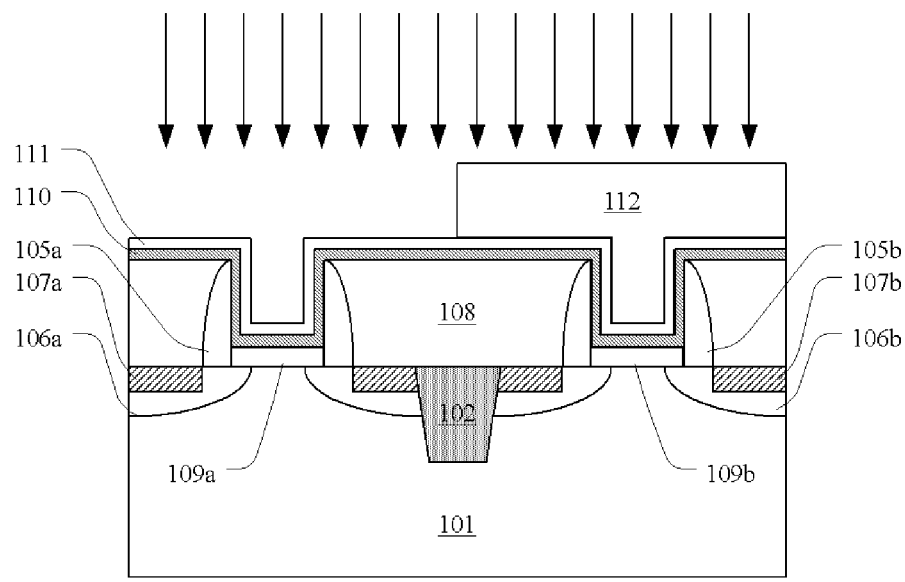

Next, a photoresist mask 112 having a pattern is formed by a photolithography process including exposure and development to shield the active region of the P-type MOSFET and to expose the active region of the N-type MOSFET. By performing ion implantation through the photoresist mask 112, an N-type dopant is implanted into the first metal gate layer 111 of the active region of the N-type MOSFET, as shown in FIG. 4. The N-type dopant for the metal gate may be one selected from a group consisting of P, As, Sb, La, Er, Dy, Gd, Sc, Yb, Er and Tb. The energy and dose for ion implantation are controlled so that the implanted dopant ions only distribute in the first metal gate layer 111 and do not enter the high-K dielectric layer 110, and so that the first metal gate layer 111 has an appropriate doping depth and concentration to obtain a desired threshold voltage. In one embodiment, the energy for ion implantation is about 0.2 KeV-30 KeV and the does is about 1E13-1E15 cm$^{-2}$. After the implantation, the photoresist mask 112 is removed by ashing or dissolving.

Figure 5:
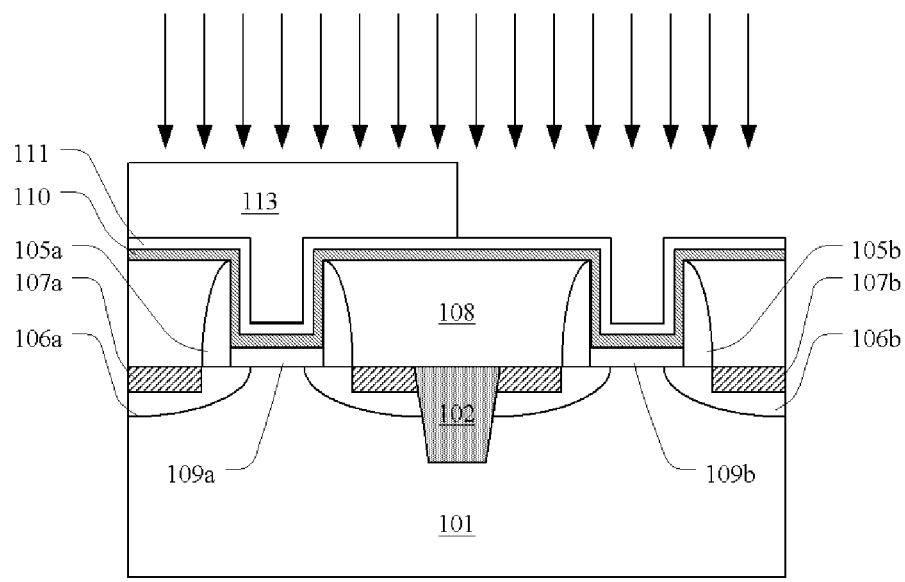

Next, a photoresist mask 113 having a pattern is formed by a photolithography process including exposure and development to shield the active region of the N-type MOSFET and to expose the active region of the P-type MOSFET. By performing ion implantation through the photoresist mask 113, a P-type dopant is implanted into the first metal gate layer 111 of the active region of the P-type MOSFET, as shown in FIG. 5. The P-type dopant for the metal gate may be one selected from a group consisting of In, B, BF$_2$, Ru, W, Mo, Al, Ga and Pt. The energy and dose for ion implantation are controlled so that the implanted dopant ions only distribute in the first metal gate layer 111 and do not enter the high-K dielectric layer 110, and so that the first metal gate layer 111 has an appropriate doping depth and concentration to obtain a desired threshold voltage. In one embodiment, the energy for ion implantation is about 0.2 KeV-30 KeV and the does is about 1E13-1E15 cm$^{-2}$. After the implantation, the photoresist mask 113 is removed by ashing or dissolving.

Figure 6:
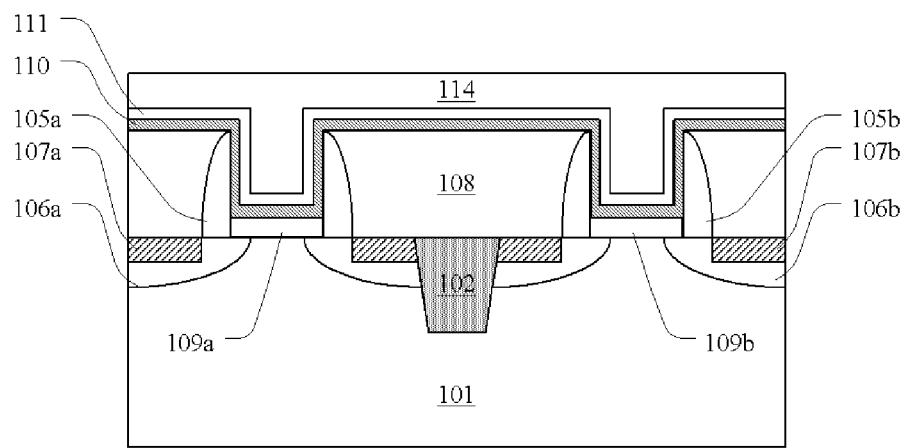

Next, a second metal gate layer 114 is formed by a known deposition method mentioned above to cover the first metal gate layer 111, as shown in FIG. 6. The second metal gate layer 114 is thick enough to at least fill up the gate opening after CMP. The second metal gate layer 114 is made of an appropriate material with a low resistance for forming the metal gate. Preferably, the second metal gate layer 114 may be made of one selected from a group consisting of W, Ti, TiAl, Al, Mo, Ta, TiN, TaN, WN and any combination thereof.

Figure 7:
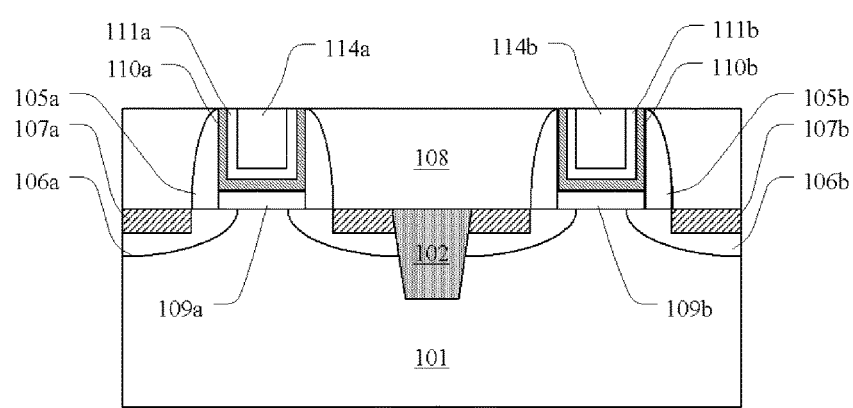

Next, by utilizing the interlayer dielectric layer 108 as a stop layer, the surface of the semiconductor structure is planarized by chemical mechanical polishing. The portions of the second metal gate layer 114, the first metal gate layer 111, the high-K dielectric layer 110 and the interfacial oxide layer 109 which are external to the gate opening are removed in the planarizing step in an order from top to bottom, so that the remaining portions of the second metal gate layer 114, the first metal gate layer 111, the high-K dielectric layer 110 and the interfacial oxide layer 109 which are inner to the gate opening function as the gate stacks for the N-type MOSFET and P-type MOSFET, respectively. It is shown in the figure that the gate stack of the N-type MOSFET comprises a second metal gate layer 114a, a first metal gate layer 111a, a high-K gate dielectric 110a and an interfacial oxide layer 109a, and the gate stack of the P-type MOSFET comprises a second metal gate layer 114b, a first metal gate layer 111b, a high-K gate dielectric 110b and an interfacial oxide layer 109b, as shown in FIG. 7. Although the gate stacks for the N-type MOSFET and the P-type MOSFET are formed by the same layers, their first metal gates contain opposite types of doping ions to perform opposite adjusting function on the effective work functions.

After accomplishment of the known contact and interconnection, the semiconductor structure mentioned above is annealed in the inert gas atmosphere (e.g. N$_2$) or weakly reducing atmosphere (e.g. the mixture atmosphere of N$_2$ and H$_2$). In one embodiment, the annealing is performed in a furnace at an annealing temperature of about 350° C.-450° C. and an annealing time of about 20-90 minutes. The implanted doping ions are driven by the annealing to diffuse and accumulate at the upper and lower interfaces of the high-K gate dielectric 110a and 110b, and to further form an electronic dipole at the lower interface of the high-K gate dielectrics 110a and 110b by interfacial reaction. Here, the upper interface of the high-K gate dielectrics 110a and 110b refers to the interface with the upper first metal gate layers 111a and 111b, and the lower interface of the high-K gate dielectrics 110a and 110b refers to the interface with the lower interfacial oxide layers 109a and 109b.

The distribution of the doping ions is changed by the annealing. On one hand, the doping ions accumulated at the upper interface of the high-K gate dielectrics 110a and 110b changes the property of the metal gate, thereby advantageously adjusting the effective work function of the corresponding MOSFET. On the other hand, the doping ions accumulated at the lower interface of the high-K gate dielectrics 110a and 110b further forms electronic dipole with appropriate polarity by interfacial reaction, thereby advantageously adjusting the effective work function of the corresponding MOSFET.

All the details of the MOSFET are not illustrated in the above description, e.g. the formation of the source/drain contacts, the additional interlayer dielectric layer and the conductive channel. It is well known for those skilled in the art about the standard CMOS process for forming the above mentioned components and application of the standard CMOS process to the MOSFET mentioned above, so it is not illustrated in detail.

The above description is only for the purpose of illustrating and describing the present invention, and is not intended to exhausting and limiting the present invention. Thus, the present invention is not limited to the illustrated embodiment. The variations or modifications which are apparent to those skilled in the art fall within the scope of the present invention.

We claim:

1. A method for manufacturing a semiconductor device having two opposite types of MOSFETs formed on one semiconductor substrate, comprising:
    forming MOSFETs on the semiconductor substrate, said MOSFETs comprising source/drain regions located in the semiconductor substrate, a dummy gate stack located between the source/drain regions and above the semiconductor substrate and a gate spacer surrounding the dummy gate stack;
    removing the dummy gate stack of said MOSFETs to expose the surface of the semiconductor substrate to form a gate opening;
    forming an interfacial oxide layer on the exposed surface of the semiconductor structure;
    forming a high-K gate dielectric on the interfacial oxide layer within the gate opening;
    forming a first metal gate layer on the high-K gate dielectric;
    implanting non-metal doping ions in the first metal gate layer, the two opposite types of MOSFETs comprise a N-type MOSFET and a P-type MOSFET, and the step of implanting doping ions into the first metal gate layer comprising:
    the P-type MOSFET is shielded, and the ion implantation is performed by implanting a first dopant which is one selected from a group consisting of P and As on the first metal gate layer of the N-type MOSFET; and
    the N-type MOSFET is shielded, and the ion implantation is performed by implanting a second dopant which is one selected from a group consisting of B and BF(2) on the first metal gate layer of the P-type MOSFET;
    forming a second metal gate layer on the first metal gate layer to fill the gate opening; and annealing at a temperature within a range between 350 degrees Centigrade and 450 degrees Centigrade to diffuse and accumulate the non-metal doping ions at an upper interface between the high-K gate dielectric and the first metal gate layer and at a lower interface between the high-K gate dielectric and the interfacial oxide, and generating an electric dipole at the lower interface between the high-K gate dielectric and the interfacial oxide by interfacial reaction.

2. The method according to claim 1, wherein the high-K gate dielectric is made of one material selected from a group consisting of $ZrO2$, $ZrON$, $ZrSiON$, $HfZrO$, $HfZrON$, $HfON$, $HfO2$, $HfAlO$, $HfAlON$, $HfSiO$, $HfSiON$, $HfLaO$, $HfLaON$ and any combination thereof.

3. The method according to claim 1, wherein the high-K gate dielectric has a thickness of about 1.5-5 nm.

4. The method according to claim 1, wherein the high-K gate dielectric is formed by means of Atomic Layer Deposition, Physical Vapor Deposition, or Metal Organic Chemical Vapor Deposition.

5. The method according to claim 4, wherein after the high-K gate dielectric is formed, the method further comprises an additional annealing to improve the quality of the high-K gate dielectric.

6. The method according to claim 1, wherein the first metal gate layer is made of one selected from a group consisting of TiN, TaN, MoN, WN, TaC, TaCN and any combination thereof.

7. The method according to claim 1, wherein the first meal gate layer has a thickness of about 2-10 nm.

8. The method according to claim 1, wherein the second metal gate layer is made of one selected from a group consisting of W, Ti, TiAl, Al, Mo, Ta, TiN, TaN, WN and any combination thereof.

9. The method according to claim 1, wherein in the step of implanting doping ions into the first metal gate layer, the energy and dose for ion implantation are controlled according to desired threshold voltage, so that the doping ions only distribute in the first metal gate layer.

10. The method according to claim 9, wherein the energy for ion implantation is about 0.2 KeV-30 KeV.

11. The method according to claim 9, wherein the dose for ion implantation is about 1E13-1E15 cm-2.

12. The method according to claim 1, wherein the first dopant is a dopant capable of reducing the effective work function.

13. The method according to claim 1, wherein the second dopant is a dopant capable of increasing the effective work function.

14. The method according to claim 1, wherein the annealing is performed in an inert gas atmosphere or weakly reducing atmosphere with an annealing time of about 20-90 minutes.

* * * * *